(12) United States Patent
McKerlie (10) Patent No.: US 12,096,601 B2
(45) Date of Patent: Sep. 17, 2024

(54) BACKING PLATE ASSEMBLY WITH JACK SCREW FOR BARE DIE DEVICE HEAT SINK APPLICATIONS TO ENSURE UNIFORM LOADING

(71) Applicant: Ciena Corporation, Hanover, MD (US)

(72) Inventor: Maxwell Thomas McKerlie, Stittsville (CA)

(73) Assignee: Ciena Corporation, Hanover, MD (US)

(*) Notice: Subject to any disclaimer, the term of this patent is extended or adjusted under 35 U.S.C. 154(b) by 58 days.

(21) Appl. No.: 17/742,596

(22) Filed: May 12, 2022

(65) Prior Publication Data
US 2023/0371208 A1 Nov. 16, 2023

(51) Int. Cl.
*H05K 7/20* (2006.01)
*H01L 23/40* (2006.01)

(52) U.S. Cl.
CPC ....... *H05K 7/2049* (2013.01); *H01L 23/4006* (2013.01); *H01L 2023/405* (2013.01); *H01L 2023/4081* (2013.01); *H01L 2023/4087* (2013.01)

(58) Field of Classification Search
CPC .............. H05K 7/2049; H05K 7/20509; H01L 23/4006; H01L 2023/4031; H01L 2023/405; H01L 2023/4075–4087
See application file for complete search history.

(56) References Cited

U.S. PATENT DOCUMENTS

| | | | | |
|---|---|---|---|---|
| 3,313,340 A | * | 4/1967 | Dubin | H05K 7/20545 165/80.3 |
| 5,662,163 A | * | 9/1997 | Mira | H01L 23/4006 361/720 |
| 5,730,620 A | * | 3/1998 | Chan | H01R 12/52 439/526 |
| 6,386,890 B1 | * | 5/2002 | Bhatt | H05K 3/325 439/67 |
| 6,475,011 B1 | * | 11/2002 | Sinha | H05K 3/325 439/330 |
| 7,095,614 B2 | * | 8/2006 | Goldmann | H01L 23/4006 165/185 |
| 7,249,954 B2 | * | 7/2007 | Weiss | H05K 1/141 439/66 |
| 7,262,969 B2 | * | 8/2007 | Lee | H01L 23/4006 165/185 |

(Continued)

FOREIGN PATENT DOCUMENTS

DE 202007003680 U1 * 9/2007 ......... H01L 23/4006

*Primary Examiner* — Zachary Pape
(74) *Attorney, Agent, or Firm* — Clements Bernard Walker; Christopher L. Bernard (57) ABSTRACT

A backing plate assembly with jack screw for bare die device heat sink applications to ensure uniform loading. The jack screw is used to force a PCB support plate and mounting plate apart, and by doing so, compresses a plurality of springs and applies uniform pressure to the heat sink, which in turn applies pressure to the bare die of the BGA device. The single jack screw is essential to the design, as it creates a single point to apply torque and compress all the springs at the same time. A lock screw is meant to maintain the position of the PCB support plate and the mounting plate. Prior to assembly, the lock screw keeps the PCB support plate and mounting plate together to ease installation.

20 Claims, 12 Drawing Sheets

(56) References Cited

U.S. PATENT DOCUMENTS

| | | | |
|---|---|---|---|
| 7,399,185 B2* | 7/2008 | Colbert | H05K 7/1061 |
| | | | 257/E23.084 |
| 8,174,106 B2* | 5/2012 | Coteus | H05K 3/325 |
| | | | 257/723 |
| 8,179,693 B2* | 5/2012 | Brodsky | H05K 7/1069 |
| | | | 361/772 |
| 10,170,391 B2* | 1/2019 | Dickover | H05K 7/2039 |
| 2018/0190596 A1* | 7/2018 | Chang | H01L 23/562 |

* cited by examiner

BACKING PLATE ASSEMBLY WITH JACK SCREW FOR BARE DIE DEVICE HEAT SINK APPLICATIONS TO ENSURE UNIFORM LOADING

FIELD OF THE DISCLOSURE

The present disclosure generally relates to PCB layout and component configuration. More particularly, the present disclosure relates to systems and methods for a backing plate assembly with jack screw for bare die device heat sink applications to ensure uniform loading.

BACKGROUND OF THE DISCLOSURE

Ball Grid Array (BGA) devices are typically packaged such that the die is encapsulated with epoxy or has a lid secured overtop of the entire device, which protects the die when a heat sink is applied. In cases where cooling is critical, it is common to have a bare die device with a stiffener ring to be able to optimize the heat path between the die and the heat sink. In most cases, the die is mechanically very fragile, and although it can withstand a reasonable amount of pressure, care must be taken when applying the heat sink to the die. Excessive load on a small area of the die, particularly the edges and corners, can cause the die to crack, thus rendering the device unusable which can cause delays and increased cost in production. Typically, the heat sink for a bare die device is attached to a backing plate with shoulder screws and springs to apply pressure to the device, with two or four mounting points located at the corners or sides of the BGA device. The challenge is securing the heat sink while keeping the contacting surface parallel to the die, and maintaining uniform pressure on the die. Sequentially torquing each screw means the spring force is unbalanced, therefore the heat sink will no longer remain parallel, resulting in high pressure points on the die which may cause the die to crack. The backing plate assembly with jack screw of the present disclosure mitigates this problem by compressing the springs evenly as the two-piece backing plate assembly is driven apart by the jack screw.

BRIEF SUMMARY OF THE DISCLOSURE

In various embodiments, the present disclosure relates to a device and methods for a backing plate assembly with jack screw for bare die device heat sink applications to ensure uniform loading. The backing plate assembly with jack screw discussed in this disclosure is a device designed to provide support for a heat sink installed onto a bare die BGA device soldered to a Printer Circuit Board (PCB), and to maintain uniform loading on the bare die during heat sink installation. The jack screw is used to force a PCB support plate and mounting plate apart, and by doing so, compresses a plurality of springs and applies uniform pressure to the heat sink, which in turn applies pressure to the bare die of the BGA device. The single jack screw is essential to the design, as it creates a single point to apply torque and compress all the springs at the same time. A lock screw is meant to maintain the position of the PCB support plate and the mounting plate. Prior to assembly, the lock screw keeps the PCB support plate and mounting plate together to ease installation.

In an embodiment, a backing plate assembly for mounting a heat sink to a module includes: a support plate disposed on a first side of a Printed Circuit Board (PCB); a mounting plate disposed over the support plate on the first side of the PCB and adapted to be fixed to a heat sink, wherein the heat sink is disposed over a device on a second side of the PCB; and a jack screw disposed in a threaded hole in the mounting plate adapted to force the mounting plate away from the support plate to compress the heat sink towards the device on the second side of the PCB. The mounting plate is fixed to the heat sink by way of a plurality of standoffs disposed through a plurality of mounting holes in the PCB. The standoffs are structural components of the mounting plate, and the standoffs are disposed on elongated members of the mounting plate. Shoulder screws and springs are utilized to fix the mounting plate to the heat sink by way of the standoffs. The heat sink does not compress onto the device until the jack screw is threaded. The backing plate assembly further includes a removable lock screw adapted to secure the mounting plate to the support plate prior to installation. The backing plate assembly further includes: alignment protrusions extending from the support plate; and alignment cutouts disposed in the mounting plate, wherein the alignment protrusions are adapted to slot into the alignment cutouts to prevent unwanted movement of the support plate during installation. The device may be a bare die Ball Grid Array (BGA) device. The heat sink may be one of a metallic fin heat sink and a liquid cooled heat sink.

In another embodiment, a module includes: a Printed Circuit Board (PCB) having a first and second side; a device disposed on the second side of the PCB; a heat sink disposed over the device on the second side of the PCB; a support plate disposed on the first side of the PCB; a mounting plate disposed over the support plate on the first side of the PCB and adapted to be fixed to the heat sink through the PCB; and a jack screw disposed in a threaded hole in the mounting plate adapted to force the mounting plate away from the support plate to compress the heat sink towards the device on the second side of the PCB. The mounting plate is fixed to the heat sink by way of a plurality of standoffs disposed through a plurality of mounting holes in the PCB. The standoffs are structural components of the mounting plate, and the standoffs are disposed on elongated members of the mounting plate. Shoulder screws and springs are utilized to fix the mounting plate to the heat sink by way of the standoffs. The heat sink does not compress onto the device until the jack screw is threaded. The backing plate assembly further includes a removable lock screw adapted to secure the mounting plate to the support plate prior to installation. The backing plate assembly further includes: alignment protrusions extending from the support plate; and alignment cutouts disposed in the mounting plate, wherein the alignment protrusions are adapted to slot into the alignment cutouts to prevent unwanted movement of the support plate during installation. The device may be a bare die Ball Grid Array (BGA) device. The heat sink may be one of a metallic fin heat sink and a liquid cooled heat sink.

In a further embodiment, a method for installing a heat sink to a device utilizing a backing plate assembly includes steps of: positioning a backing plate assembly on a first side of a Printed Circuit Board (PCB), wherein a plurality of standoffs of the backing plate assembly protrude through a plurality of mounting holes in the PCB; placing a heat sink onto a device on a second side of the PCB; fixing the heat sink to the standoffs of the backing plate assembly through the mounting holes in the PCB; removing a lock screw of the backing plate assembly; and torquing a jack screw of the backing plate assembly to drive the components of the backing plate assembly apart until the desired mounting force of the heat sink onto the device is achieved. The heat sink does not compress onto the device until the jack screw is threaded.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, in various embodiments, the present disclosure relates to a device and methods for a backing plate assembly with jack screw for bare die device heat sink applications to ensure uniform loading. The backing plate assembly with jack screw discussed in this disclosure is a device designed to provide support for a heat sink installed onto a bare die BGA device soldered to a Printer Circuit Board (PCB), and to maintain uniform loading on the bare die during heat sink installation. The jack screw is used to force a PCB support plate and mounting plate apart, and by doing so, compresses a plurality of springs and applies uniform pressure to the heat sink, which in turn applies pressure to the bare die of the BGA device. The single jack screw is essential to the design, as it creates a single point to apply torque and compress all the springs at the same time. A lock screw is meant to maintain the position of the PCB support plate and the mounting plate. Prior to assembly, the lock screw keeps the PCB support plate and mounting plate together to ease installation.

Heat sink applications to bare die Ball Grid Array (BGA) devices is not uncommon in the industry, however some solutions do not scale well for a high-volume production environment. For sprung heat sinks, a torque pattern and gradual tightening of the shoulder screws is generally implemented as a means of ensuring even compression of the springs during installation. This tends to lead to longer assembly times and is prone to human error if the torque pattern/interval is not followed. Another known solution implements the use of a support frame around the heat sink with cam levers to compress the springs. This solution occupies significant placement room on the PCB and therefore is not practical to implement on the size/form factor of current modules.

Some solutions require the use of adjustable standoffs (in the form of a set screw, a standard standoff shimmed to the appropriate height, or a floating standoff secured in place with an adhesive) that are set during assembly by the installer and provides a fixed height for the heat sink. The present Invention accounts for the variation in die height from one module to the next and ensures the heat sink is parallel to the die but requires customization of each heat sink to each module.

The known solutions that are currently implemented for this application all require significant operator touch time to do correctly, and if done incorrectly can lead to damaged devices. Some of the known solutions also require different mechanical parts to adjust for the variation in device height. The time and attention required by the operator is not practical for high-volume production manufacturing lines, which often employ unskilled labor. It is important to have simple assembly instructions that minimize opportunities for human error and are consistent from one assembly to the next.

As stated, BGA devices are typically packaged such that the die is encapsulated with epoxy or has a lid secured overtop of the entire device, which protects the die when a heat sink is applied. In cases where cooling is critical and high heat transfer is necessary between the device and a heat sink, it is common to have a bare die device with a stiffener ring to be able to optimize the heat path between the die and the heat sink. In most cases, the die is mechanically very fragile when the device is not encapsulated, and although it can withstand a reasonable amount of pressure, care must be taken when applying the heat sink to the die. Excessive load on a small area of the die, particularly the edges and corners, can cause the die to crack, thus rendering the device unusable which can cause delays and increased cost in production.

Typically, the heat sink for a bare die device is attached to a backing plate with shoulder screws and springs to apply pressure to the device, with two or four mounting points located at the corners or sides of the BGA device. The challenge is securing the heat sink while keeping the contacting surface parallel to the die, and maintaining uniform pressure on the die. Sequentially torquing each screw means the spring force is unbalanced, therefore the heat sink will no longer remain parallel, resulting in high pressure points on the die which may cause the die to crack. The backing plate assembly with jack screw of the present disclosure mitigates this problem by compressing the springs evenly as the two-piece backing plate assembly is driven apart by the jack screw.

The main components of the design are the PCB support plate, the mounting plate, the jack screw, and the lock screw. The PCB support plate includes a PCB contact surface, jack screw bearing surface, alignment protrusions, and a threaded hole. The PCB contact surface has an insulator gasket to provide electrical isolation between the metal and the PCB.

The jack screw bearing surface is where the driving force is applied by the jack screw. The alignment protrusions prevent rotation while torque is applied to the jack screw. The threaded hole is where the lock screw is threaded.

The mounting plate includes a threaded hole, self-clinching standoffs, alignment cutouts, and a through hole. The threaded hole is where the jack screw is threaded. The self-clinching standoffs provide mounting points for the shoulder screws, as well as locate the mounting plate with the mounting holes in the PCB for alignment of the backing plate assembly. The alignment cutouts mate with the alignment protrusions of the PCB support plate.

The jack screw is used to force the PCB support plate and mounting plate apart, and by doing so compresses the springs and applies pressure to the heat sink, which in turn applies pressure to the bare die of the BGA device. The single jack screw is essential to the design, as it creates a single point to apply torque and compress all the springs at the same time.

The lock screw is meant to maintain the position of the PCB support plate and the mounting plate. Prior to assembly, the lock screw keeps the PCB support plate and mounting plate together to ease installation.

It will be appreciated that the components described herein may be replaced by similar components offering the same features, and the BGA device of the present disclosure may be any device which requires a heat sink.

Figure 1:
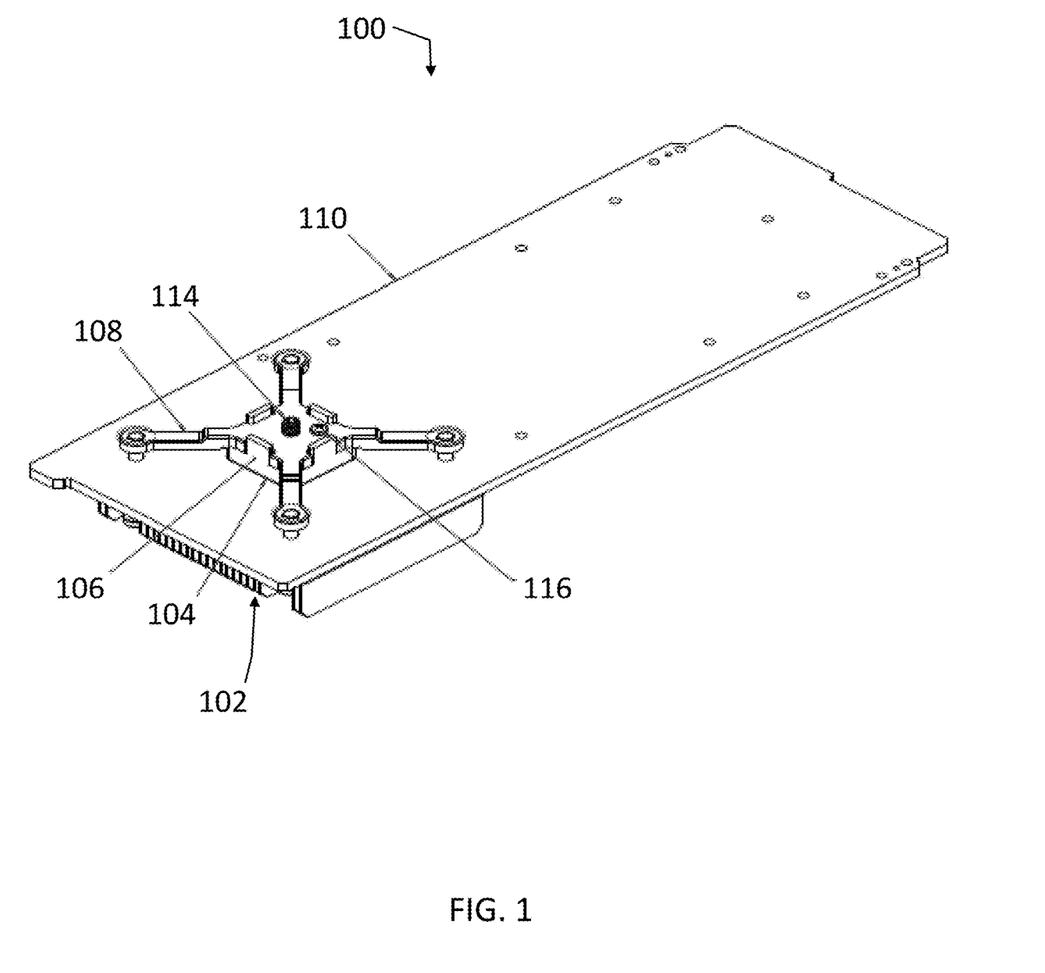
FIG. 1 is a diagram of a back surface of a hardware module, or simply a module which may also be referred to as a circuit pack, a line module, a blade, etc.

FIG. 1 is a diagram of a module 100. The module 100 may be a hardware module, which may also be referred to as a circuit pack, a line module, a blade, etc. The module 100 includes a heat sink 102 coupled to the module. The heat sink 102 may be any conventional metallic fin heat sink or any other heat sink such as a liquid cooled heat sink or the like. A backing plate assembly 104 is adapted to couple the heat sink to a BGA device, central processing unit (CPU), or another device of the like, hereinafter referred to as a device (shown in FIG. 2). The backing plate assembly 104 is adapted to apply even and constant pressure onto the heat sink 102, allowing for effective contact of the heat sink 102 to the device, resulting in adequate heat dispersion and even force over the surface of the device. The backing plate assembly 104 will be described further herein. Note, the backing plate assembly 104 includes a support plate 106 and a mounting plate 108.

The module 100 further includes a printed circuit board (PCB) 110. The PCB 110 includes a plurality of mounting holes 112 on which the backing plate assembly 104 is coupled. The backing plate assembly 104 is coupled to the mounting holes 112 in such a way as to allow a plurality of springs to compress the backing plate assembly 104 onto the PCB 110, thus compressing the heat sink 102 onto the device.

The backing plate assembly 104 further includes a jack screw 114, the jack screw 114 adapted to force the support plate 106 and mounting plate 108 apart, and by doing so compresses the springs (shown in FIG. 3) and applies pressure to the heat sink 102, which in turn applies pressure to the device. The backing plate assembly also includes a lock screw 116 adapted to maintain the position of the support plate 106 and the mounting plate 108. The lock screw 116 keeps the support plate 106 and mounting plate 108 together before the backing plate assembly 104 is installed to ease the installation process.

Figure 2:
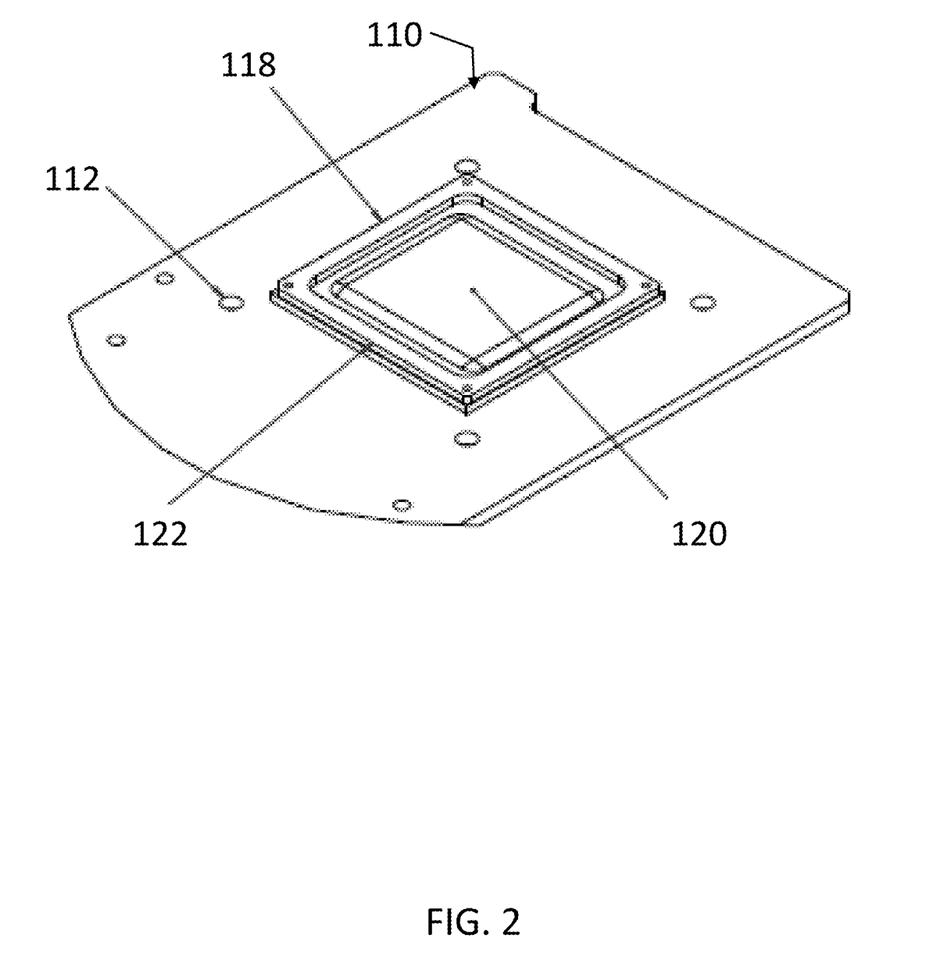
FIG. 2 is a diagram of a bare die device mounted to a Printed Circuit Board (PCB).

FIG. 2 is a diagram of a bare die device 118 mounted to a Printed Circuit Board (PCB) 110. The device 118 of the present disclosure includes a bare die 120 and a stiffener ring 122. The bare die 120 of the device 118 is the surface on which the heat sink 102 must make even contact with in order to prevent the device 118 from becoming damaged. The stiffener ring 122 of the device 118 of the present disclosure is adapted to aid in optimizing the heat path between the die 120 and the heat sink 102. It will be appreciated that the current device 118 with bare die 120 and stiffener ring 122 can be a different device, or have different components in various formats, and the device shown and described in the present embodiments shall be contemplated as a non-limiting example.

The PCB 110 also includes mounting holes 112 disposed through the PCB 110 and located at the corners or sides of the device 118. The present embodiment includes four mounting holes 112, but it will be appreciated that any number of mounting holes 112 can be present in any location on the PCB 110 to fulfill the mounting of the heat sink 102 and backing plate assembly 104.

Figure 3:
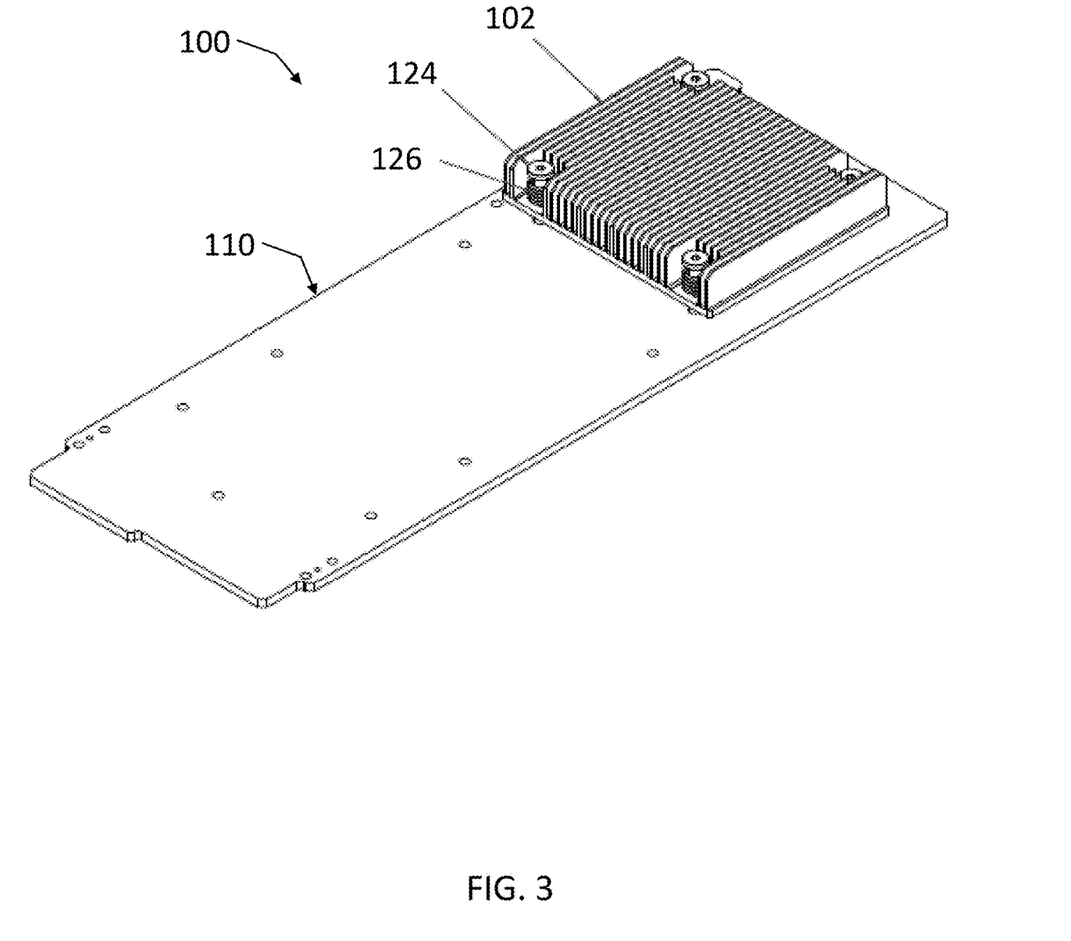
FIG. 3 is a diagram of a heat sink mounted to the PCB of FIG. 2, covering the bare die device.

FIG. 3 is a diagram of a heat sink 102 mounted to the PCB 110 of FIG. 2, covering the bare die device 118 of the present disclosure. The heat sink 102 may be any conventional metallic fin heat sink or any other heat sink such as a liquid cooled heat sink or the like. The PCB 110 again includes a plurality of mounting holes 112 (not visible) for the mounting of the heat sink 102 and backing plate assembly 104. The heat sink 102 and backing plate assembly 104 are secured together through the mounting holes 112 by a plurality of shoulder screws 124 and springs 126.

The heat sink 102 is installed onto the device 118 and secured to the mounting plate 108 with the shoulder screws 124 and springs 126. The shoulder screws 124 are torqued until seated on the mounting plate 108. The springs 126 shall have little/no compression once the shoulder screw 124 is fully seated, and once the jack screw 114 is tightened, the springs 126 will begin to compress the heat sink 102 onto the device 118, thus securing the heat sink 102 evenly and carefully onto the device 118 for enhanced heat transfer.

Again, the mounting holes 112 disposed through the PCB 110 and located at the corners or sides of the device 118 through which the shoulder screws 124 are disposed may be altered. The present embodiment includes four mounting holes 112 with shoulder screws 124 disposed through each mounting hole 112, but it will be appreciated that any number of mounting holes 112 and shoulder screws 124 can be present in any location on the PCB 110 to fulfill the mounting of the heat sink 102 and backing plate assembly 104.

Figure 4:
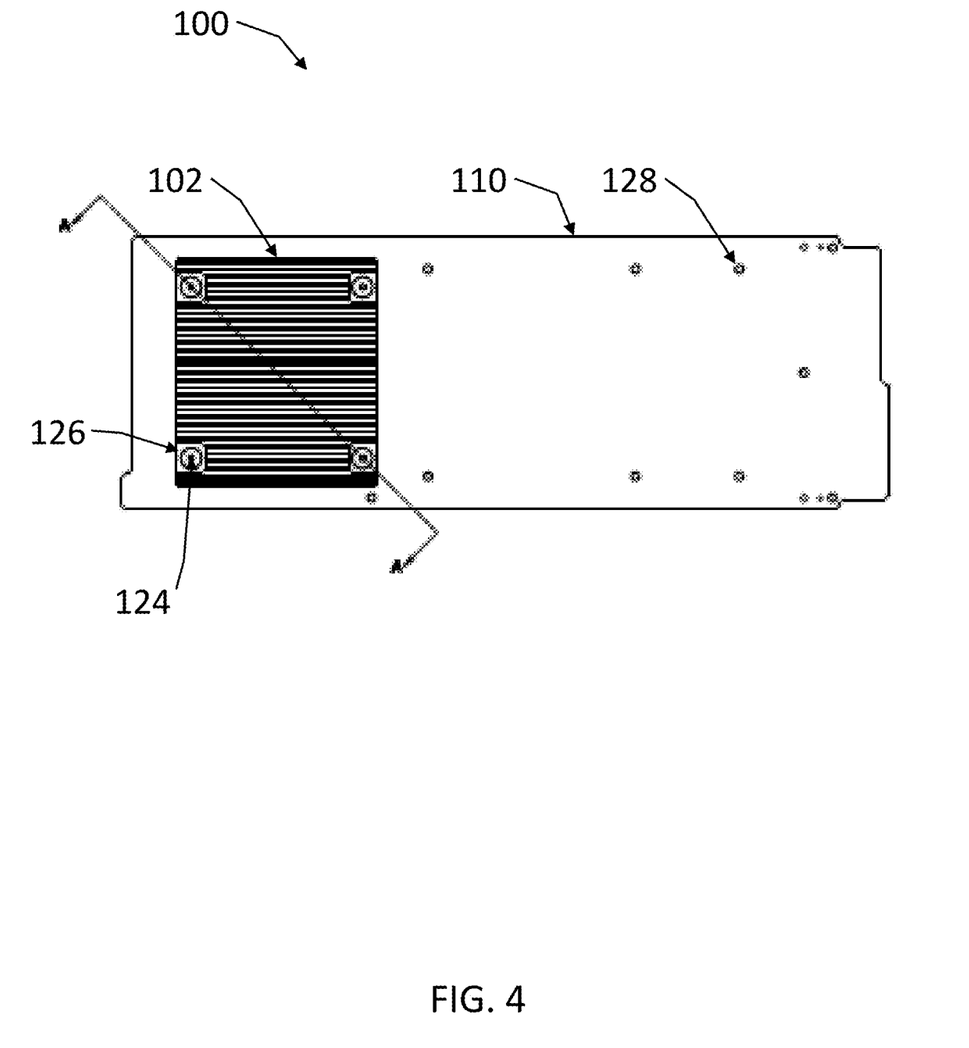
FIG. 4 is a top view diagram of the heat sink mounted to the PCB of FIG. 2, covering the bare die device.

FIG. 4 is a top view diagram of the heat sink 102 mounted to the PCB 110 of FIG. 2, covering the bare die device 118 of the present disclosure. Again, the heat sink 102 may be any conventional metallic fin heat sink or any other heat sink such as a liquid cooled heat sink or the like. The PCB 110 again includes the plurality of mounting holes 112 (not visible) for the mounting of the heat sink 102 and backing plate assembly 104, and also includes a plurality of additional holes 128 for mounting various other components to the PCB 110 or for mounting the PCB 110 to other structures. The heat sink 102 and backing plate assembly 104 are secured together through the mounting holes 112 by a plurality of shoulder screws 124 and springs 126.

Additionally, the heat sink 102 of the present disclosure is square in shape with the shoulder screws 124 and springs 126 located at the corners of the heat sink 102. In various other embodiments, the heat sink 102 and location of the shoulder screws 124 and springs 126 may be different. For example, the heat sink 102 may be a different shape, requiring the location and number of the shoulder screws 124 and springs 126 to be different.

Figure 5:
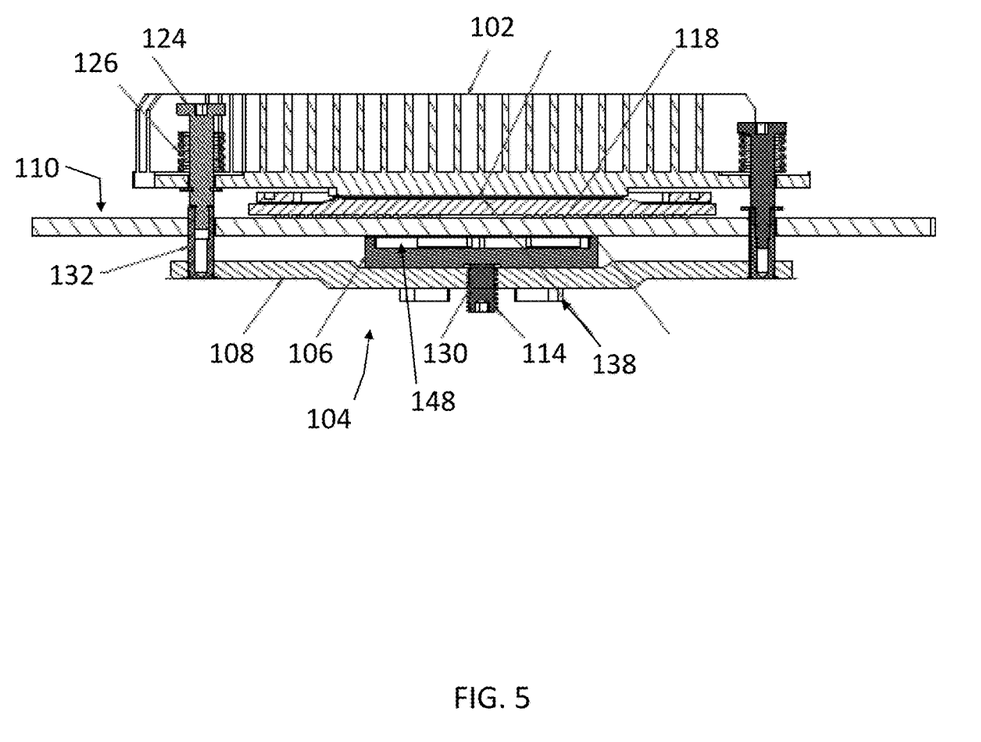
FIG. 5 is a cross section view of the heat sink, bare die device, PCB, and the backing plate assembly with Jack Screw of the present disclosure.

FIG. 5 is a cross section view of the heat sink 102, bare die device 118, PCB 110, and the backing plate assembly 104 with Jack Screw 114 of the present disclosure. The backing plate assembly 104 includes the support plate 106, the mounting plate 108, the jack screw 114, and the lock screw 114 (not shown in FIG. 5).

Figure 8:
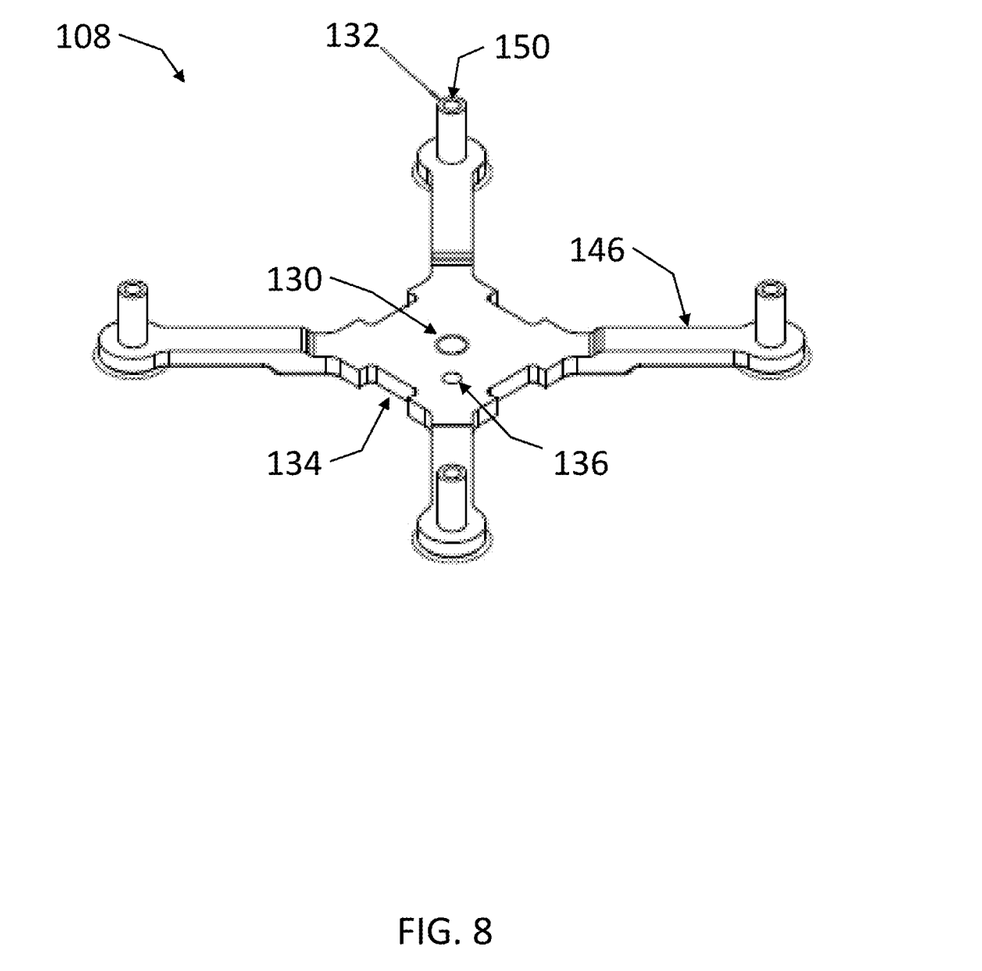
FIG. 8 is a top view diagram of a mounting plate of the backing plate assembly with Jack Screw of the present disclosure.

The mounting plate 108 includes a threaded hole 130, standoffs 132, alignment cutouts 134 (FIG. 8), and a through hole 136 (FIG. 8). The threaded hole 130 is where the jack screw 116 is threaded. The standoffs 132 provide mounting points for the shoulder screws 124, as well as locate the mounting plate 108 with the mounting holes 112 in the PCB 110 for alignment of the backing plate assembly 104. The alignment cutouts 134 mate with the alignment protrusions 138 of the PCB support plate 106.

The standoffs 132 of the mounting plate 108 are adapted to receive the threaded end of the shoulder screws 124, both of which are disposed through the mounting holes 112 in the PCB 110. Once the shoulder screws 124 are placed through the heat sink 102 and threaded into the standoffs 132, the jack screw 114 can be threaded through the threaded hole 130 in the mounting plate 108 to push on the support plate 106. This forces the mounting plate 108 and the support plate 106 apart, causing the heat sink 102 to be pulled towards the PCB 110, making contact with the device 118. The support plate 106 additionally includes a hollowed area 148 to allow clearance for components on the PCB 110.

Note that the heat sink 102 does not compress onto the device 118 until the jack screw 116 is threaded. This allows the heat sink 102 to maintain a parallel attitude in relation to the device 118 in order to eliminate high pressure points during installation.

The backing plate assembly 104 of the present disclosure can be installed by positioning the backing plate assembly 104 on the opposing side of the PCB 110 to the device 118. The standoffs 132 protrude into the mounting holes 112 in the PCB 110. The PCB support plate 106 and mounting plate 108 are in contact via the jack screw 114 loosely threaded into the threaded hole 130 and are temporarily held together by the lock screw 116. The heat sink 102 is installed onto the device 118 and secured to the mounting plate 108 with the shoulder screws 124 and springs 126. The shoulder screws 124 are torqued until seated on the standoffs 132 on the mounting plate 108. The springs 126 shall have little/no compression once the shoulder screws 124 are fully seated. The lock screw 116 is removed and the jack screw 114 is torqued, driving the mounting plate 108 away from the support plate 106, until the desired compression of the springs 126 is achieved.

In the various embodiments described herein, the side of the PCB 110 on which the backing plate assembly 104 is disposed may be referred to as the first side of the PCB 110, and the side of the PCB 110 on which the heat sink 102 and device 118 are disposed may be referred to as the second side of the PCB 110.

Figure 6:
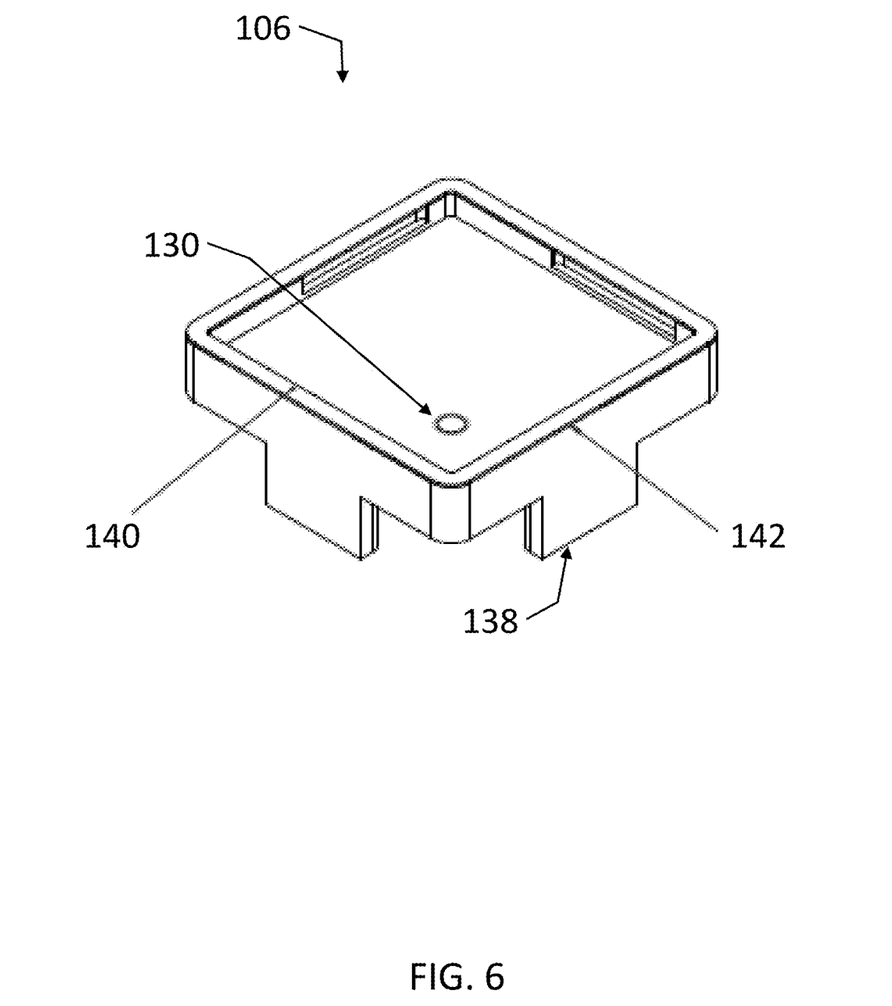
FIG. 6 is a top view diagram of a support plate of the backing plate assembly with Jack Screw of the present disclosure.

FIG. 6 is a top view diagram of a support plate 106 of the backing plate assembly 104 of the present disclosure. The support plate 106 includes a PCB contact surface 142, jack screw bearing surface 144 (FIG. 7), alignment protrusions 138, and a threaded hole 130 for the lock screw 116. The PCB contact surface 142 has an insulator gasket 140 to provide electrical isolation between the metal and the PCB 110. The jack screw bearing surface 144 is where the driving force is applied by the jack screw 114. The alignment protrusions 138 prevent rotation while torque is applied to the jack screw 114. The threaded hole 130 is where the lock screw 116 is threaded to temporarily hold the support plate 106 to the mounting plate 108.

Figure 7:
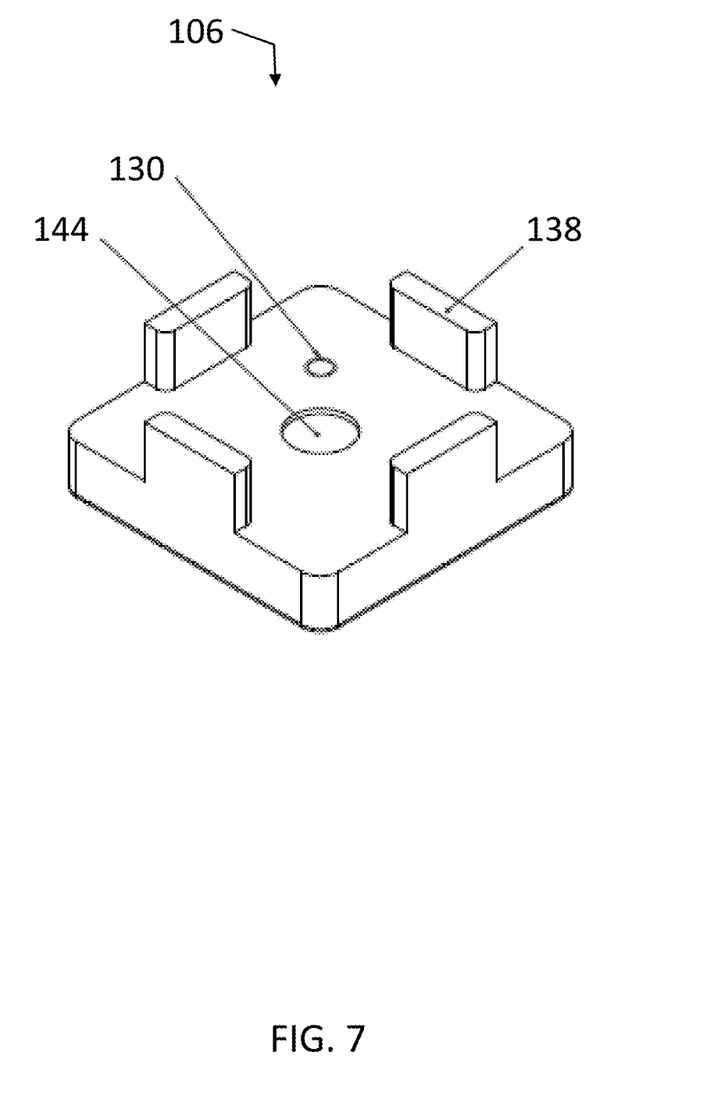
FIG. 7 is a bottom view diagram of a support plate of the backing plate assembly with Jack Screw of the present disclosure.

FIG. 7 is a bottom view diagram of a support plate 106 of the backing plate assembly 104 of the present disclosure. The support plate 106 again includes the PCB contact surface 142, jack screw bearing surface 144, alignment protrusions 138, and a threaded hole 130 for the lock screw 116. The jack screw bearing surface 144 can be seen more clearly in FIG. 7 and is where the driving force is applied by the jack screw 114. The alignment protrusions 138 can be seen protruding from the support plate 106 and prevent rotation while torque is applied to the jack screw 114. The support plate 106 can be manufactured from any rigid material suitable for installation in a module 100 described in the present disclosure.

FIG. 8 is a top view diagram of a mounting plate 108 of the backing plate assembly 104 of the present disclosure. The mounting plate 108 includes a threaded hole 130, standoffs 132, alignment cutouts 134, and a through hole 136. The threaded hole 130 is where the jack screw 116 is threaded. The standoffs 132 provide mounting points for the shoulder screws 124, as well as locate the mounting plate 108 with the mounting holes 112 in the PCB 110 for alignment of the backing plate assembly 104. The alignment cutouts 134 mate with the alignment protrusions 138 of the PCB support plate 106.

The standoffs 132 of the mounting plate 108 include additional threaded holes 150 which are adapted to receive the threaded end of the shoulder screws 124, both of which are disposed through the mounting holes 112 in the PCB 110. Once the shoulder screws 124 are placed through the heat sink 102 and threaded into the standoffs 132, the jack screw 114 can be threaded through the threaded hole 130 in the mounting plate 108 to push on the support plate 106. This forces the mounting plate 108 and the support plate 106 apart, causing the heat sink 102 to be pulled towards the PCB 110, contacting the device 118.

The mounting plate 108 further includes a plurality of elongated members 146 on which the standoffs 132 are disposed. The present embodiment includes four elongated members 146 which extend to reach the mounting holes 112 for installation of the heat sink 102. It will be appreciated that other embodiments may include any number and orientation of the elongated members 146 in order to facilitate the mounting of the required components.

Figure 9:
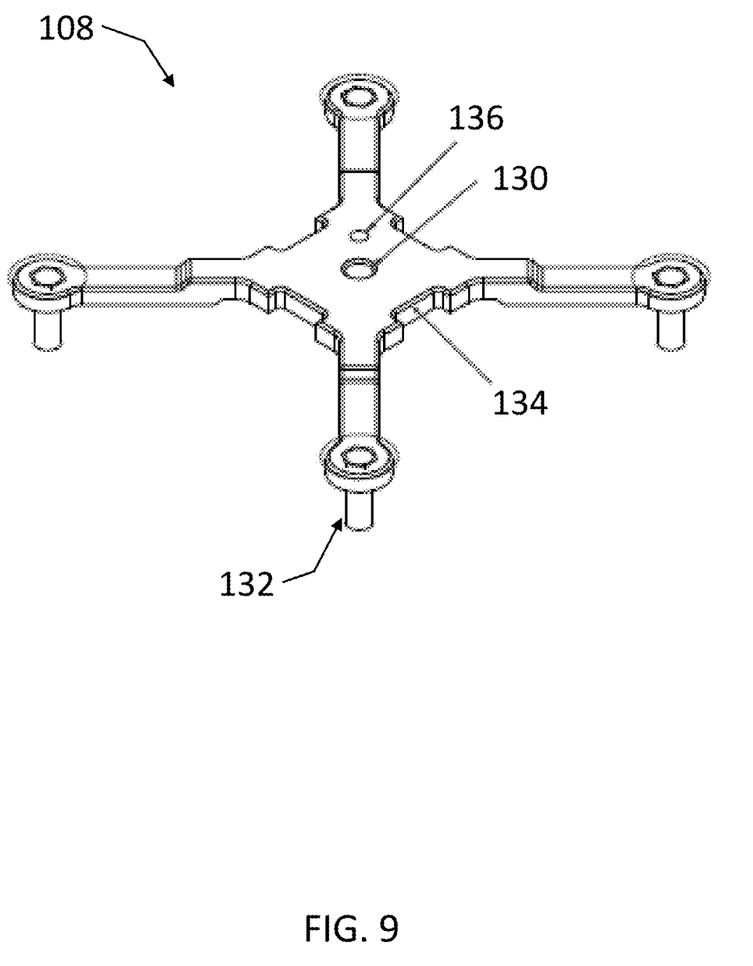
FIG. 9 is a bottom view diagram of a mounting plate of the backing plate assembly with Jack Screw of the present disclosure.

FIG. 9 is a bottom view diagram of a mounting plate 108 of the backing plate assembly 104 of the present disclosure. The mounting plate 108 again includes a threaded hole 130, standoffs 132, alignment cutouts 134, and a through hole 136. The threaded hole 130 is where the jack screw 116 is threaded. The standoffs 132 provide mounting points for the shoulder screws 124, as well as locate the mounting plate 108 with the mounting holes 112 in the PCB 110 for alignment of the backing plate assembly 104. The alignment cutouts 134 mate with the alignment protrusions 138 of the PCB support plate 106.

Figure 10:
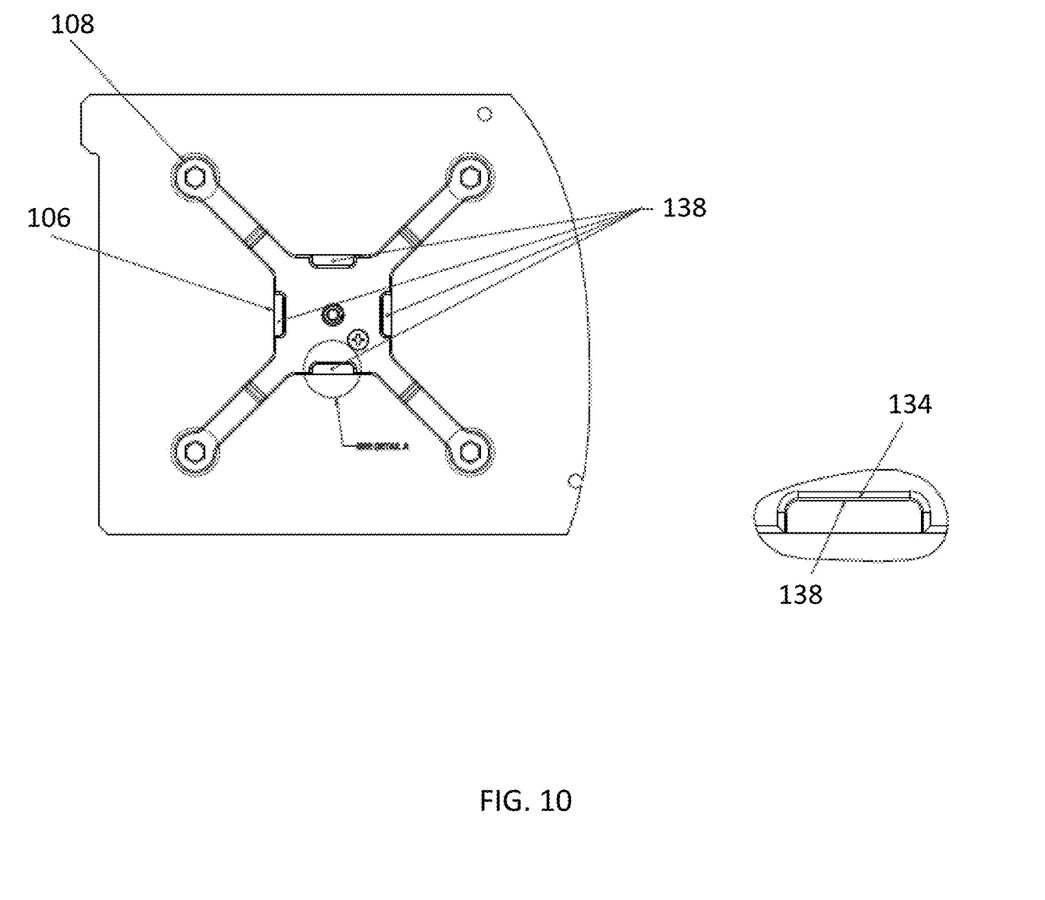
FIG. 10 is a diagram of the mounting plate with detailed view of alignment features.

FIG. 10 is a diagram of the mounting plate 108 with detailed view of alignment features. The alignment features of the present disclosure being the alignment protrusions 138 of the support plate 106 and the alignment cutouts 134 of the mounting plate 108. FIG. 10 shows the mounting plate 108 and support plate 106 disposed on the PCB 110. The alignment protrusions 138 of the support plate 106 fit into the alignment cutouts 134 of the mounting plate 108, allowing the mounting plate 108 and support plate 106 to only move in a single axis relative to each other. This prevents the support plate 106 from rotating underneath the mounting plate 108 as the jack screw 116 is tightened.

Figure 11:
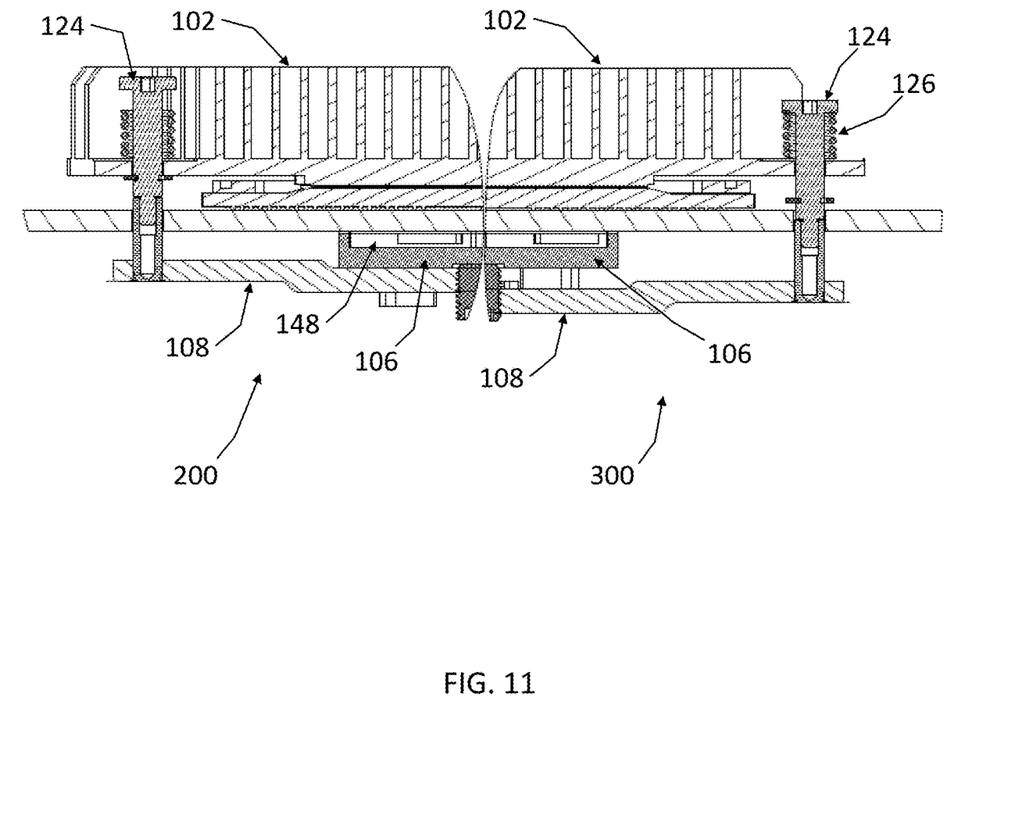
FIG. 11 is a cross section of the backing plate assembly with Jack Screw of the present disclosure in an uncompressed state and fully installed state for comparison.

FIG. 11 is a cross section of the backing plate assembly 104 with Jack Screw 114 of the present disclosure in an uncompressed state 200 and fully installed state 300 for comparison. In the uncompressed state 200, the support plate 106 and mounting plate 108 are not separated, and the shoulder screws 124 are not introducing force onto the heat sink 102. Alternatively, in the fully installed state 300, the support plate 106 and mounting plate 108 are separated by the jack screw 114, forcing the shoulder screws 124 to compress the heat sink 102 onto the device 118.

The present disclosure provides the backing plate assembly 104 with jack screw 114 to remove the need for a specific torque pattern or gradual tightening of the shoulder screws 124. A torque driver set with the appropriate torque can be used to quickly secure the shoulder screws 124 in place. Similarly, a torque driver set to the appropriate torque or number of turns can be used to torque the jack screw 114 until the desired compression of the springs 126 is achieved. This allows for the same process to be used on all assemblies by the operator at the high-volume production manufacturing facility.

The embodiments described herein provide the following benefits over typical heat sink mounting methods.

A two-piece backing plate assembly 104, with alignment features to maintain the relative in-plane position of the PCB support plate 106 and the mounting plate 108 parallel to the PCB 110 surface, while allowing free movement in the normal direction.

A single jack screw 114 located in the central axis of the backing plate assembly 104, threaded into the mounting plate 108 and contacting the bearing surface 144 of the PCB support plate 106.

A single location to tension the springs 126 to secure a heat sink 102 to a bare die BGA device 118, by torquing the jack screw 114 to drive the PCB support plate 106 and mounting plate 108 apart, normal to the PCB 110 surface.

A method of securing a heat sink 102 to a bare die BGA device 118 in a manner that maintains even spring 126 compression and parallelism between the heat sink 102 and the bare die 120 during installation, thus preventing damage to the device 118.

A method of securing a heat sink 102 to a bare die BGA device 118 that allows for the same components (backing plate assembly 104, shoulder screws 124, springs 126, etc.) to be used with any height tolerance of the same bare die device 118 on different assemblies of the same module 100.

Figure 12:
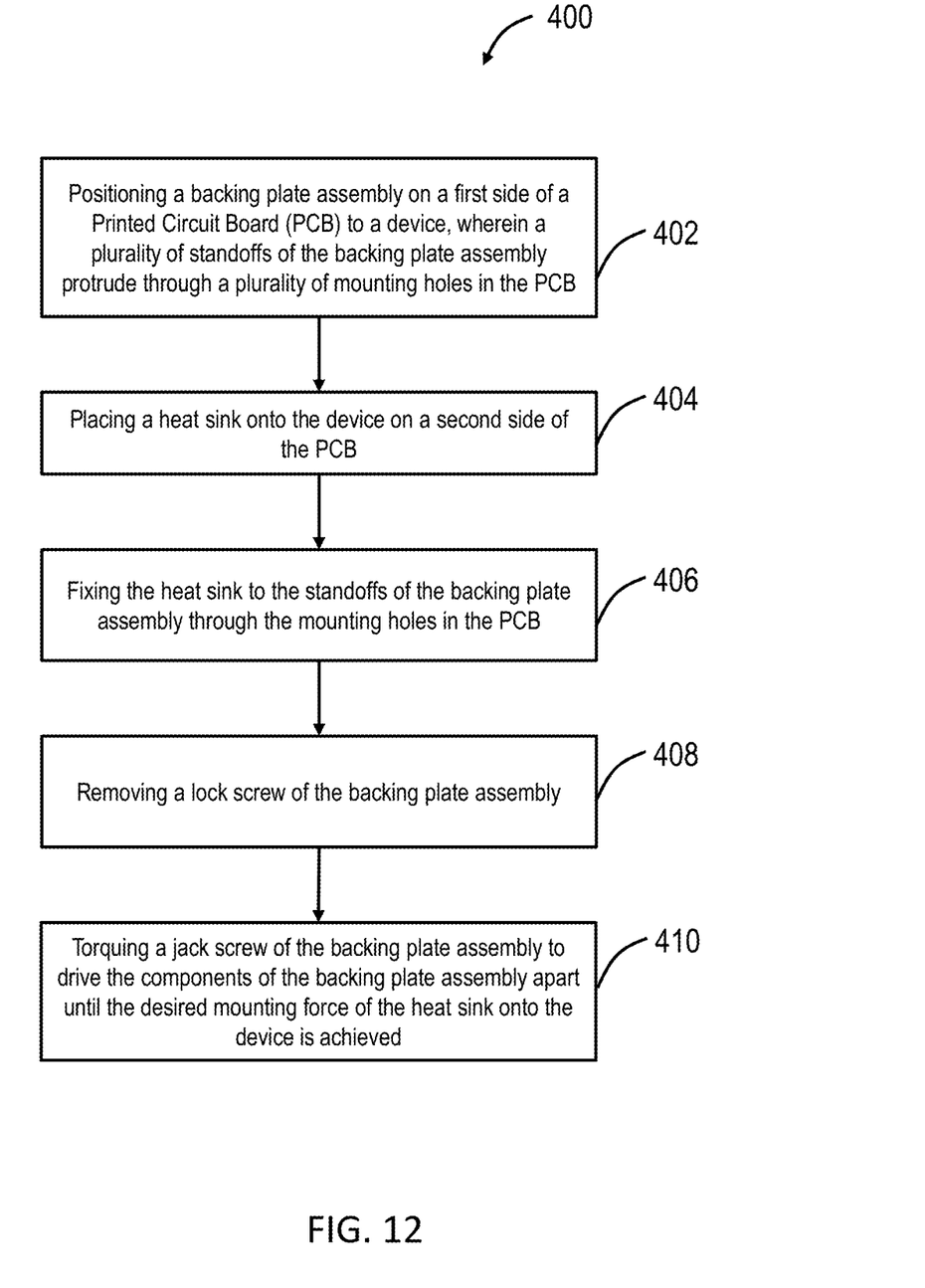
FIG. 12 is a flow diagram of a method for installing the backing plate assembly with jack screw of the present disclosure.

FIG. 12 is a flow diagram of a method 400 for installing the backing plate assembly with jack screw of the present disclosure. The method includes positioning 402 the backing plate assembly on the opposing side of the PCB to the BGA device with the self-clinching standoffs protruding into the mounting holes in the PCB. The PCB support plate and mounting plate are contacting with the jack screw loosely threaded into the mounting plate threaded hole. The heat sink is placed 404 onto the BGA device and fixed 406 to the mounting plate with the shoulder screws and springs. Additionally, the shoulder screws are torqued until seated on the self-clinching standoffs on the mounting plate. The springs shall have little/no compression once the shoulder screw is fully seated. The lock screw is removed 408, freeing the support plate from the mounting plate. The jack screw is torqued 410, driving the mounting plate away from the PCB support plate, until the desired compression of the heat sink to the device is achieved.

Note, as described herein, directional terms such as top and bottom are meant to indicate a relationship between components and not necessarily exact locations. Also, these components can be referred to as a first component, a second component, etc.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. A backing plate assembly for mounting a heat sink to a module, the backing plate assembly comprising:
    a support plate disposed on a first side of a Printed Circuit Board (PCB);
    a mounting plate disposed over the support plate on the first side of the PCB and adapted to be fixed to the heat sink, wherein the heat sink is disposed over a device on a second side of the PCB; and
    a jack screw disposed in a threaded hole in the mounting plate adapted to force the mounting plate away from the support plate to compress the heat sink towards the device on the second side of the PCB;
    wherein the support plate comprises alignment protrusions extending from an outside edge of a perimeter of the support plate, the mounting plate comprises alignment cutouts recessed in an outside edge of a perimeter of the mounting plate, and the alignment protrusions are adapted to slot into the alignment cutouts on the first side of the PCB to prevent unwanted rotation of the support plate with respect to the mounting plate when the mounting plate is translated with respect to the support plate when the jack screw is tightened.

2. The backing plate assembly of claim 1, wherein the mounting plate is fixed to the heat sink by way of a plurality of standoffs disposed through a plurality of mounting holes in the PCB.

3. The backing plate assembly of claim 2, wherein the standoffs are structural components of the mounting plate, and the standoffs are disposed on elongated members of the mounting plate, wherein the elongate members each extend from a central portion of the mounting plate.

4. The backing plate assembly of claim 2, wherein shoulder screws and springs are utilized to fix the mounting plate to the heat sink by way of the standoffs.

5. The backing plate assembly of claim 1, wherein the heat sink does not compress onto the device until the jack screw is threaded.

6. The backing plate assembly of claim 1, further comprising a removable lock screw adapted to secure the mounting plate to the support plate prior to installation.

7. The backing plate assembly of claim 1, wherein the device is a bare die Ball Grid Array (BGA) device.

8. The backing plate assembly of claim 1, wherein the heat sink is one of a metallic fin heat sink and a liquid cooled heat sink.

9. The backing plate assembly of claim 1, wherein the support plate and alignment protrusions are integrally formed.

10. The backing plate assembly of claim 1, wherein each protrusion comprises a rectangular tab, and each cutout defines a complementary rectangular slot configured to receive the rectangular tab of an associated protrusion.

11. A module comprising:
- a Printed Circuit Board (PCB) having a first and second side;
- a device disposed on the second side of the PCB;
- a heat sink disposed over the device on the second side of the PCB;
- a support plate disposed on the first side of the PCB;
- a mounting plate disposed over the support plate on the first side of the PCB and adapted to be fixed to the heat sink through the PCB; and
- a jack screw disposed in a threaded hole in the mounting plate adapted to force the mounting plate away from the support plate to compress the heat sink towards the device on the second side of the PCB;
- wherein the support plate comprises alignment protrusions extending from an outside edge of a perimeter of the support plate, the mounting plate comprises alignment cutouts recessed in an outside edge of a perimeter of the mounting plate, and the alignment protrusions are adapted to slot into the alignment cutouts on the first side of the PCB to prevent unwanted rotation of the support plate with respect to the mounting plate when the mounting plate is translated with respect to the support plate when the jack screw is tightened.

12. The module of claim 11, wherein the mounting plate is fixed to the heat sink by way of a plurality of standoffs disposed through a plurality of mounting holes in the PCB.

13. The module of claim 12, wherein the standoffs are structural components of the mounting plate, and the standoffs are disposed on elongated members of the mounting plate, wherein the elongate members each extend from a central portion of the mounting plate.

14. The module of claim 12, wherein shoulder screws and springs are utilized to fix the mounting plate to the heat sink by way of the standoffs.

15. The module of claim 11, wherein the heat sink does not compress onto the device until the jack screw is threaded.

16. The module of claim 11, further comprising a removable lock screw adapted to secure the mounting plate to the support plate prior to installation.

17. The module of claim 11, wherein the device is a bare die Ball Grid Array (BGA) device.

18. The module of claim 11, wherein the heat sink is one of a metallic fin heat sink and a liquid cooled heat sink.

19. A method for installing a heat sink to a device utilizing a backing plate assembly, the method comprising steps of:
- positioning a backing plate assembly on a first side of a Printed Circuit Board (PCB), wherein a plurality of standoffs of the backing plate assembly protrude through a plurality of mounting holes in the PCB;
- placing a heat sink onto a device on a second side of the PCB;
- fixing the heat sink to the standoffs of the backing plate assembly through the mounting holes in the PCB;
- removing a lock screw of the backing plate assembly; and
- torquing a jack screw of the backing plate assembly to drive the components of the backing plate assembly apart until the desired mounting force of the heat sink onto the device is achieved;
- wherein the backing plate assembly comprises a support plate and a mounting plate disposed over the support plate; and
- wherein the support plate comprises alignment protrusions extending from an outside edge of a perimeter of the support plate, the mounting plate comprises alignment cutouts recessed in an outside edge of a perimeter of the mounting plate, and the alignment protrusions are adapted to slot into the alignment cutouts on the first side of the PCB to prevent unwanted rotation of the support plate with respect to the mounting plate when the mounting plate is translated with respect to the support plate when the jack screw is torqued.

20. The method of claim 19, wherein the heat sink does not compress onto the device until the jack screw is threaded.

* * * * *